United States Patent
Noro et al.

(10) Patent No.: US 8,269,213 B2
(45) Date of Patent: Sep. 18, 2012

(54) EPOXY RESIN COMPOSITION FOR SEMICONDUCTOR ENCAPSULATION AND SEMICONDUCTOR DEVICE PRODUCED BY USING THE SAME

(75) Inventors: Hiroshi Noro, Ibaraki (JP); Naohide Takamoto, Ibaraki (JP); Eiji Toyoda, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 12/600,578

(22) PCT Filed: May 14, 2008

(86) PCT No.: PCT/JP2008/058846
§ 371 (c)(1),
(2), (4) Date: Nov. 17, 2009

(87) PCT Pub. No.: WO2008/143085
PCT Pub. Date: Nov. 27, 2008

(65) Prior Publication Data
US 2010/0148379 A1    Jun. 17, 2010

(30) Foreign Application Priority Data
May 17, 2007  (JP) .................. 2007-131993

(51) Int. Cl.
*H01L 23/29*  (2006.01)
(52) U.S. Cl. .......... 257/40; 257/793; 257/E23.119
(58) Field of Classification Search .......... 257/793, 257/40, E23.119
See application file for complete search history.

(56) References Cited

U.S. PATENT DOCUMENTS

| | | | | |
|---|---|---|---|---|
| 5,360,861 A | * | 11/1994 | Campbell | 524/494 |
| 6,566,422 B1 | * | 5/2003 | Yagi et al. | 523/440 |
| 2002/0151106 A1 | * | 10/2002 | Noro et al. | 438/118 |

FOREIGN PATENT DOCUMENTS

| JP | 06-228280 A | | 8/1994 |
|---|---|---|---|
| JP | 09-216936 A | | 8/1997 |
| JP | 2000-086866 A | | 3/2000 |
| JP | 2002-012654 A | | 1/2002 |
| JP | 2002-348438 A | | 12/2002 |
| JP | 2003-105064 A | | 4/2003 |
| JP | 2004-203983 A | | 7/2004 |
| JP | 2006-169407 | * | 6/2006 |
| JP | 2006-249149 A | | 9/2006 |

OTHER PUBLICATIONS

Notification of Transmittal of Translation of the International Preliminary Report on Patentability (Form PCT/IB/338) of International Application No. PCT/JP2008/058846 mailed May 14, 2008 with Written Opinion (Forms PCT/IB/373 and PCT/ISA/237).
International Search Report of PCT/JP2008/058846, mailing date of Aug. 19, 2008.

* cited by examiner

*Primary Examiner* — Marc Armand
(74) *Attorney, Agent, or Firm* — Westerman, Hattori, Daniels & Adrian, LLP

(57) ABSTRACT

An epoxy resin composition for semiconductor encapsulation, which comprises: (A) an epoxy resin having at least two epoxy groups in a molecule thereof; (B) a compound having at least two phenolic hydroxyl groups in a molecule thereof; and (C) particles of a compound represented by general formula (1), the particles having a maximum particle diameter of not greater than 30 μm and a standard deviation of not greater than 5 μm, the particles being dispersed in the epoxy resin composition:

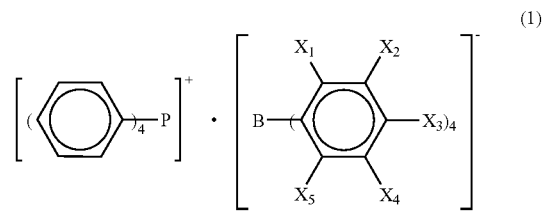

(1)

wherein $X_1$ to $X_5$, which may be the same or different, are each a hydrogen atom, an alkyl group having 1 to 9 carbon atoms, or a fluorine atom. The epoxy resin composition is an encapsulation material excellent in pot life, fluidity and curability, and has a lower chloride ion content. The epoxy resin composition provides a highly reliable semiconductor device excellent in moisture resistant reliability.

6 Claims, No Drawings

EPOXY RESIN COMPOSITION FOR SEMICONDUCTOR ENCAPSULATION AND SEMICONDUCTOR DEVICE PRODUCED BY USING THE SAME

TECHNICAL FIELD

The present invention relates to an epoxy resin composition for semiconductor encapsulation, which is excellent in pot life, fluidity and curability, and has a lower content of impurity ions such as chloride ions, and to a highly reliable semiconductor device produced by using the epoxy resin composition.

BACKGROUND ART

Nowadays, thermosetting resin compositions mainly containing an epoxy resin are used for a wide variety of applications in production of semiconductor devices. Exemplary applications of such a thermosetting resin composition include semiconductor element encapsulation materials, die attachment materials, prepreg materials, under-fill materials and the like. For these applications, the thermosetting resin composition is provided in a tablet form, a liquid form, a sheet form or the like. The form of the thermosetting resin composition is properly selected depending upon the application. Characteristic properties required for all the applications are an electrically insulative property, an adhesive property, a lower content of an ionic impurity, and handling ease with improved pot life and fluidity.

DISCLOSURE OF THE INVENTION

Problems to be Solved by the Invention

In general, a liquid resin composition is prepared by using a curing agent mainly containing an acid anhydride in combination with an epoxy resin for fluidity. Where the acid anhydride is used as the curing agent, carboxyl groups are present in a cured product of the thermosetting resin composition after the curing of the thermosetting resin composition. This is known to reduce the moisture resistant reliability.

On the other hand, a sheet-type adhesive agent is generally prepared by blending an epoxy resin (curable component) and an imidazole curing accelerator in a certain type of thermoplastic resin composition for ensuring satisfactory pot life and curability. If the epoxy resin is cured alone, a cured product of the epoxy resin is hard and fragile. Since the imidazole curing accelerator is used as the curing accelerator, it is difficult to reduce the content of chloride ions.

In view of the foregoing, it is an object of the present invention to provide an epoxy resin composition for semiconductor encapsulation which is excellent in pot life, fluidity and curability, and has a lower chloride ion content for use in production (encapsulation) of a semiconductor device, and to provide a semiconductor device produced by using the epoxy resin composition for semiconductor encapsulation.

Means for Solving the Problems

According to the present invention to achieve the aforementioned object, there is provided an epoxy resin composition for semiconductor encapsulation comprising: (A) an epoxy resin having at least two epoxy groups in a molecule thereof; (B) a compound having at least two phenolic hydroxyl groups in a molecule thereof; and (C) a powder of a compound represented by the following general formula (1), the powder having a maximum particle diameter of not greater than 30 μm and a standard deviation of not greater than 5 μm, the powder being dispersed in the epoxy resin composition:

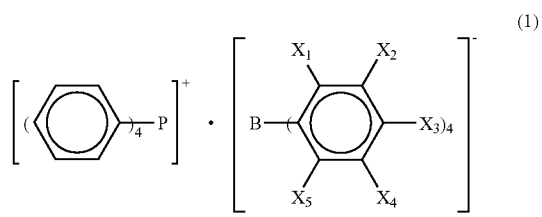

(1)

wherein $X_1$ to $X_5$/which may be the same or different, are each a hydrogen atom, an alkyl group having 1 to 9 carbon atoms, or a fluorine atom.

According to a second aspect of the present invention, there is provided a semiconductor device produced by encapsulating a semiconductor element with the epoxy resin composition for semiconductor encapsulation.

The inventors of the present invention conducted intensive studies on a formulation to provide an encapsulation material which is excellent in pot life, fluidity and curability and has a lower chloride ion content. As a result of an intensive study on a curing accelerator, the inventors found that, where powder of a quaternary phosphonium salt represented by the above general formula (1) and having a maximum particle diameter and a standard deviation not greater than specific levels is used as a curing accelerator, the quaternary phosphonium salt can be homogeneously dispersed in the epoxy resin composition, thereby permitting an even curing reaction. Therefore, an epoxy resin composition excellent in fluidity, pot life and curability and having a lower chloride ion content can be provided. Thus, the inventors achieved the aforementioned object, and attained the present invention.

Effects of the Invention

The present invention provides the epoxy resin composition for semiconductor encapsulation in which the powder of the quaternary phosphonium salt (Component (C)) represented by the aforementioned general formula (1) and having a maximum particle diameter and a standard deviation not greater than the specific levels is dispersed as a curing accelerator. Therefore, the epoxy resin composition thus provided is usable as an encapsulation material, which is excellent in pot life, fluidity and curability, and has a lower chloride ion content. Therefore, the semiconductor device can be efficiently produced through resin encapsulation with the inventive epoxy resin composition for semiconductor encapsulation having satisfactory curability. In addition, the semiconductor device is highly reliable with an excellent moisture resistant reliability, because the epoxy resin composition for semiconductor encapsulation has a lower content of impurity ions such as chloride ions.

Where the epoxy resin composition for semiconductor encapsulation further comprises a thermoplastic resin (Component (D)), the epoxy resin composition for semiconductor encapsulation can be easily formed into a sheet.

Where the epoxy resin composition for semiconductor encapsulation has a reaction exothermic peak temperature of 150° C. to 200° C. as measured by a differential scanning calorimeter with heating at a temperature increase rate of 10° C./min, and has a reaction exothermic calorific value accounting for not less than 80% of a total reaction exothermic calorific value as measured within a temperature range of the reaction exothermic peak temperature±30° C., the curing reaction evenly proceeds without local variation, thereby allowing for advantageous resin encapsulation.

BEST MODE FOR CARRYING OUT THE INVENTION

An inventive epoxy resin composition for semiconductor encapsulation is prepared by using an epoxy resin (Component (A)), a phenolic compound (Component (B)) and a specific curing accelerator (Component (C)), and is typically used in a powdery form, in a tablet form resulting from tableting of the powdery resin composition, or in a sheet form.

The epoxy resin (Component (A)) is not particularly limited as long as the epoxy resin has at least two epoxy groups in its molecule. Any of conventionally known epoxy resins may be used. Examples of the epoxy resins include bisphenol-A epoxy resins, bisphenol-F epoxy resins, novolak epoxy resins such as phenol novolak epoxy resins and cresol novolak epoxy resins, alicyclic epoxy resins, nitrogen-containing epoxy resins such as triglycidyl isocyanurate and hydantoin epoxy resins, hydrogenated bisphenol-A epoxy resins, aliphatic epoxy resins, glycidyl ether epoxy resins, bisphenol-S epoxy resins, biphenyl epoxy resins which typically provide cured products of a lower water absorption type, dicyclic epoxy resins and triphenylmethane epoxy resins. Among these epoxy resins, the bisphenol-A epoxy resins, the bisphenol-F epoxy resins and the triphenylmethane epoxy resins, which are in a liquid form at a temperature not higher than 50° C., are preferred for fluidity. These epoxy resins may be used either alone or in combination. In general, the epoxy resin preferably has an epoxy equivalent of 90 to 1000 g/eq for proper control of the mechanical strength and the glass transition temperature of a cured produce of the epoxy resin composition. The proportion of the epoxy resin is preferably 5 to 90 wt %, more preferably 10 to 80 wt %, based on the overall weight of the epoxy resin composition for heat resistance and moisture resistance.

The phenolic compound (Component (B)) serving as the curing agent for the epoxy resin (Component (A)) is not particularly limited as long as the phenolic compound contains at least two phenolic hydroxyl groups in its molecule. Examples of the phenolic compound include cresol novolak resins, phenol novolak resins, dicyclopentadiene phenol resins, phenol aralkyl resins, and allyl phenol resins prepared by introducing an allyl group into a naphthol resin or any of the aforementioned phenol resins. These may be used either alone or in combination. Among these phenol resins, the phenol resins, which each have a softening point of 40 to 70° C., are preferred for fluidity and curability.

The blending ratio of the epoxy resin (Component (A)) and the phenolic compound (Component (B)) is preferably such that reactive hydroxyl groups of the phenolic compound (Component (B)) are present in a proportion of 0.5 to 1.5 equivalents, particularly preferably 0.7 to 1.2 equivalents, per equivalent of the epoxy groups of the epoxy resin (Component (A)). If the proportion of the hydroxyl groups is less than 0.5 equivalents, the resulting epoxy resin composition is liable to have a reduced curing speed, and its cured product has a lower glass transmission temperature. If the proportion of the hydroxyl groups is greater than 1.5 equivalents, the moisture resistance tends to be reduced. Where any other curing agent is used in combination with the phenolic compound (Component (B)), the blending ratio is determined in the same manner as in the case in which the phenolic compound (Component (B)) is used alone as the curing agent.

The specific curing accelerator (Component (C)) to be used in combination with Component (A) and Component (B) is powder of a quaternary phosphonium salt represented by the following general formula (1):

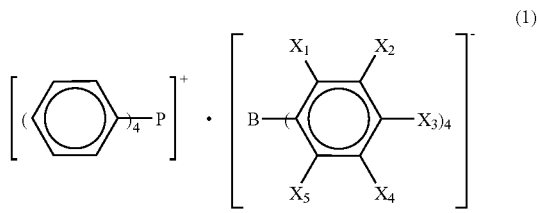

wherein $X_1$ to $X_5$, which may be the same or different, are each a hydrogen atom, an alkyl group having 1 to 9 carbon atoms, or a fluorine atom.

Where the powder of this compound is in a particulate form having a specific particle size distribution and is dispersed in a solid phase in the epoxy resin composition, this compound effectively serves as a potential curing accelerator.

In the formula (1), $X_1$ to $X_5$, which may be the same or different, are each a hydrogen atom, an alkyl group having 1 to 9 carbon atoms, or a fluorine atom. For the potential curing accelerating property and the curability, a quaternary phosphonium salt with $X_1$ to $X_5$ being each a hydrogen atom, a quaternary phosphonium salt with one of $X_1$ to $X_5$ being an alkyl group having 1 to 3 carbon atoms and the rest of $X_1$ to $X_5$ being each a hydrogen atom, and a quaternary phosphonium salt with one of $X_1$ to $X_5$ being a fluorine atom and the rest of $X_1$ to $X_5$ being each a hydrogen atom are particularly preferred. Specific examples of the quaternary phosphonium salt include tetraphenylphosphonium tetraphenylborate, tetraphenylphosphonium tetra(4-methylphenyl)borate and tetraphenylphosphonium tetra(4-fluorophenyl)borate, which may be used either alone or in combination.

The powder of the quaternary phosphonium salt represented by the above general formula (1) should have a maximum particle diameter not greater than 30 μm, preferably not greater than 10 μm, and a standard deviation not greater than 5 μm, preferably not greater than 2 μm, for the curability and the solder bondability of the epoxy resin composition containing the quaternary phosphonium salt. If the maximum particle diameter is greater than 30 μm and the standard deviation is greater than 5 μm, it is impossible to provide desired curability, so that contact failure between electrodes is liable to occur due to uneven curing of the epoxy resin composition. The powder of the quaternary phosphonium salt represented by the general formula (1), which has such a particle size distribution, may be prepared by disintegrating the quaternary phosphonium salt to the predetermined particle sizes, for example, by a mortar, a jet mill or a bead mill, or by taking out particles having predetermined particle sizes through air classification. The maximum particle diameter herein means the greatest one of particle sizes detected when the sizes of particles, for example, randomly sampled from a population are measured by a laser diffractive scattering particle size distribution analyzer. Further, the standard deviation herein means the width of the particle size distribution of particles, for example, randomly sampled from a population as in the aforementioned case, the width of the particle size distribution being determined from the following expression (a):
Standard Deviation $$(\mu m)=[\Sigma\{(X(J)-\text{Mean})^2 \times q(J)/100\}]^{1/2} \quad (a)$$

wherein J is a particle diameter classification number, q(J) is a frequency distribution value (%), X(J) is a representative value (μm) of a J-th particle diameter range, and Mean is an average diameter (μm).

The amount of the aforementioned specific curing accelerator (Component (C)) to be blended is properly selected so as to provide a cured product within a desired curing period in consideration of the curability of the epoxy resin composition. In general, the curing accelerator is preferably present in the epoxy resin composition in a proportion of 0.1 to 10 wt %.

As an index of the curability, the inventive epoxy resin composition for semiconductor encapsulation preferably has a reaction exothermic peak temperature of 150° C. to 200° C. as measured by a differential scanning calorimeter with heating at a temperature increase rate of 10° C./min, and preferably has a reaction exothermic calorific value accounting for not less than 80% of a total reaction exothermic calorific value as measured within the temperature range of the reaction exothermic peak temperature±30° C. Thus, the curing reaction evenly proceeds without local variation. In the measurement with the differential scanning calorimeter, a sample and a reference substance to be subjected to the measurement are temperature-controlled by heating or cooling to be kept under the same conditions, and an energy required for keeping a temperature difference between the sample and the reference substance at 0 (zero) is recorded with respect to the time or the temperature.

Where the inventive epoxy resin composition for semiconductor encapsulation is formed into a sheet, the epoxy resin composition may contain a thermoplastic resin (Component (D)) in addition to Components (A) to (C) as required. Examples of the thermoplastic resin include alkyl acrylate copolymers, acrylonitrile-butadiene copolymers, hydrogenated acrylonitrile-butadiene copolymers, styrene-butadiene-styrene copolymers and epoxy-modified styrene-butadiene-styrene copolymers, which may be used either alone or in combination.

The proportion of the thermoplastic resin (Component (D)) to be blended is not particularly limited, as long as the epoxy resin composition can be formed into a sheet. The proportion of the thermoplastic resin is preferably 1 to 60 wt %, more preferably 3 to 30 wt %, based on the total weight of the organic resin component for proper wafer bonding, cutting and machining, and chip mounting. If the proportion of the thermoplastic resin is greater than 60 wt %, the adhesiveness is likely to be significantly reduced. If the proportion of the thermoplastic resin is less than 1 wt %, the resulting thermosetting resin composition tends to suffer from cracking when being formed into a sheet.

As required, the inventive epoxy resin composition for semiconductor encapsulation may further contain an inorganic filler. Examples of the inorganic filler include spherical silica, crushed silica, silica-titania composite particles, silica-germanium composite particles, electrically conductive particles such as gold particles, silver particles and nickel particles, and organic polymer particles coated with an electrically conductive metal such as acryl particles plated with gold. For the transparency and the moisture resistance of the epoxy resin composition, the silica-titanium composite particles are particularly preferred. These inorganic fillers may be used either alone or in combination.

The proportion of the inorganic filler to be blended is preferably not greater than 90 wt %, particularly preferably 10 to 80 wt %, based on the overall weight of the epoxy resin composition.

As required, the inventive epoxy resin composition for semiconductor encapsulation may contain, in addition to the aforementioned components, a silane coupling agent, a titanium coupling agent, a surface conditioner, an antioxidant, a tackifier, a silicone oil, a silicone rubber, a synthetic rubber and/or a reactive diluent for reduction of stress. Further, the inventive epoxy resin composition for semiconductor encapsulation may further contain an ion trapping agent such as a hydrotalcite or bismuth hydroxide for improvement of reliability in a moisture resistant reliability test.

The inventive epoxy resin composition for semiconductor encapsulation can be prepared, for example, in the following manner. Predetermined amounts of the epoxy resin (Component (A)) and the phenolic compound (Component (B)) are blended and melt-mixed with each other at a temperature higher than the softening points thereof by means of HOMODISPER or the like. Then, a predetermined amount of the specific quaternary phosphonium salt (Component (C)) is added to the resulting mixture maintained at 40° C. to 80° C., and dispersed in the mixture with stirring by HOMODISPER or the like.

Alternatively, predetermined amounts of the epoxy resin (Component (A)) and the phenolic compound (Component (B)) are mixed and dissolved in an organic solvent (e.g., toluene, methyl ethyl ketone, ethyl acetate or the like). Then, a predetermined amount of the specific quaternary phosphonium salt (Component (C)) is added as the curing accelerator to the resulting mixture, and dispersed in the mixture with stirring by HOMODISPER. Thereafter, the organic solvent may be removed, as required, by heating at a reduced pressure.

The epoxy resin composition can be prepared in a sheet form in the following manner. Predetermined amounts of the epoxy resin (Component (A)), the phenolic compound (Component (B)) and the thermoplastic resin (Component (D)) are blended, mixed together, and dissolved in an organic solvent (e.g., toluene, methyl ethyl ketone, ethyl acetate or the like). Then, a predetermined amount of the specific quaternary phosphonium salt (Component (C)) is added to the resulting mixture, and dispersed in the mixture with stirring by HOMODISPER. In turn, the resulting mixture solution is applied onto a predetermined releasable sheet, and the resulting releasable sheet is heated to be dried for removal of the organic solvent. Thus, an intended sheet of the epoxy resin composition is produced.

As described above, the epoxy resin composition thus prepared preferably has a reaction exothermic peak temperature of 150° C. to 200° C. as measured by a differential scanning calorimeter with heating at a temperature increase rate of 10° C./min, and preferably has a reaction exothermic calorific value accounting for not less than 80% of a total reaction exothermic calorific value as measured within the temperature range of the reaction exothermic peak temperature±30° C. With such characteristics, the curing reaction of the epoxy resin composition evenly proceeds without local variation.

A method of encapsulating a semiconductor element with the epoxy resin composition for semiconductor encapsulation is not particularly limited, but any of known methods may be employed according to the type of encapsulation. For example, a known molding method such as an ordinary transfer molding method may be employed. Thus, the inventive semiconductor device is produced.

EXAMPLES

Next, inventive examples will be described in conjunction with comparative examples. However, the present invention is not limited to these examples.

First, the following ingredients were prepared.
Epoxy Resin-a
Liquid bisphenol-A epoxy resin (having an epoxy equivalent of 185 g/eq and a viscosity of 14.4 Pa·s/25° C.)
Epoxy Resin-b
Triphenylmethane epoxy resin (having an epoxy equivalent of 170 g/eq, a softening point of 60° C. and a viscosity of 0.1 Pa·s/150° C.)

by means of a jet mill (PJM-80SP available from Nippon Pneumatic MFG. Co., Ltd.) to prepare powders A to H of the curing accelerators having different particle sizes as shown in Table 1. The following four types of conditions were employed for triturating by the jet mill. The maximum particle size and the standard deviation shown in Table 1 were measured by the aforementioned method.

Conditions-1: Not triturated
Conditions-2: Triturated at a pressure of 1.0 kg at a flow rate of 10 g/min
Conditions-3: Triturated at a pressure of 4.5 kg at a flow rate of 2 g/min
Conditions-4: Triturated at a pressure of 0.5 kg at a flow rate of 30 g/min

TABLE 1

|  | Triturated curing accelerator | | | | | | | |
| --- | --- | --- | --- | --- | --- | --- | --- | --- |
|  | A | B | C | D | E | F | G | H |
| Type of curing accelerator | a | | | b | c | d | e | a |
| Triturating conditions | | | | | | | | |
| Conditions-1 | | | | | | | | |
| Maximum particle size (μm) | 40 | — | — | — | — | — | — | — |
| Standard deviation (μm) | 5.5 | — | — | — | — | — | — | — |
| Conditions-2 | | | | | | | | |
| Maximum particle size (μm) | — | 10 | — | 8 | 9 | 30 | 8 | — |
| Standard deviation (μm) | — | 1.5 | — | 1.0 | 1.4 | 4.8 | 1.1 | — |
| Conditions-3 | | | | | | | | |
| Maximum particle size (μm) | — | — | 7 | — | — | — | — | — |
| Standard deviation (μm) | — | — | 0.9 | — | — | — | — | — |
| Conditions-4 | | | | | | | | |
| Maximum particle size (μm) | — | — | — | — | — | — | — | 28 |
| Standard deviation (μm) | — | — | — | — | — | — | — | 4.8 |

Curing Agent-a
Phenol novolak resin (having a hydroxyl equivalent of 104 g/eq, a softening point of 63° C. and a viscosity of 0.03 Pa·s/150° C.)
Curing Agent-b
Xylylene phenol resin (having a hydroxyl equivalent of 174 g/eq and a viscosity of 0.4 Pa·s/150° C.)
Curing Agent-c
Curing agent-c (a melt-mixture of Curing accelerator-a to be described below and Curing agent-a described above) was prepared by melt-mixing 0.67 g of Curing accelerator-a and 56.2 g of Curing agent-a at 170° C. for 1 hour.
Thermoplastic Resin
An alkyl acrylate copolymer (AR-51 available from Nippon Zeon Corporation)
Curing Accelerator-a
Tetraphenylphosphonium tetraphenylborate
Curing Accelerator-b
Tetraphenylphosphonium tetra(4-methylphenyl)borate
Curing Accelerator-c
Tetraphenylphosphonium tetra(4-fluorophenyl)borate
Curing Accelerator-d
Triphenylphosphine
Curing Accelerator-e
2-phenyl-4,5-dihydroxy dimethylimidazole Before intended epoxy resin compositions were prepared, the aforementioned curing accelerators were each triturated Examples 1 to 7 and Comparative Examples 1 to 5

Of the aforementioned ingredients, an epoxy resin, a curing agent and a thermoplastic resin were blended in proportions shown in Table 2 or 3 in 40 parts by weight of methyl ethyl ketone (solvent), and the resulting mixture was melt-mixed by means of a homomixer. Then, a curing accelerator was blended in a proportion shown in Table 2 or 3 to the mixture, and dispersed in the mixture with stirring at a rotation speed of 3000 rpm for 10 minutes by the homomixer. Thereafter, the resulting dispersion was thermally dried at 100° C. for 5 minutes for removal of the solvent. Thus, intended epoxy resin compositions were each prepared.

The epoxy resin compositions thus prepared were evaluated for the dispersibility of the curing accelerator in the resin component, the pot life, the curability and the impurity ion (chloride ion) content through measurement performed in the following manner. The results are also shown in Tables 2 and 3.

Dispersibility of Curing Accelerator in Resin Component

The epoxy resin compositions were each observed by a microscope. An epoxy resin composition in which insoluble matter was dispersed in the resin component was rated as excellent (o), and an epoxy resin composition in which insoluble matter was not observed in the resin component was rated as unacceptable (x).

Pot Life

For evaluation, the viscosity increase rate (viscosity change rate) of each of the epoxy resin compositions was calculated from the following mathematical expression based on an initial viscosity and a viscosity measured after the composition was stored at 35° C. for 24 hours. An epoxy resin composition having a viscosity change rate of not greater than 20% was rated as excellent (o), and an epoxy resin composition having a viscosity change rate of greater than 20% was rated as unacceptable (x). With the use of 1 g of the epoxy resin composition, the viscosities were measured by means of an E-type viscometer (HAAKE's RS-1) having a rotary plate diameter of 35 mm with a gap and a rotation speed being set to 100 µm and 10(1/S), respectively.

Viscosity change rate(%)=[$V(24)-V(0)$]×100/$V(0)$ wherein V(24) is the viscosity measured after the storage at 35° C. for 24 hours, and V(0) is the viscosity measured immediately after the ingredients were mixed.

Curability

With the use of 10 mg of each of the epoxy resin compositions, calorific values were measured at a temperature increase rate of 10° C./min by means of a differential scanning calorimeter (EXSTAR6000 available from Seiko Instruments Inc.), and (1) a reaction exothermic peak temperature and (2) the proportion of a reaction exothermic calorific value with respect to the overall exothermic calorific value as measured within the temperature range of the reaction exothermic peak temperature±30° C. were calculated. Calorific value proportions thus calculated are shown. An epoxy resin composition having a calorific value proportion of not less than 80% was rated as excellent (o), and an epoxy resin composition having a calorific value proportion of less than 80% was rated as unacceptable (x).

Impurity Ion (Chloride Ion) Content

After the epoxy resin compositions were each cured at 175° C. for 1 hour, a cured product was pulverized by a mixer. Then, particles (sample) pulverized as having particle diameters not greater than 100 µm were sieved out. Then, 5 g of the sample was dispersed in 50 cc of pure water, and boiled in the water at 160° C. for 20 hours for elution. The chloride ion content of the resulting aqueous solution was determined by ion chromatography, and evaluated based on the following criteria. An epoxy resin composition having a chloride ion content of not greater than 200 ppm was rated as excellent (o), and an epoxy resin composition having a chloride ion content of greater than 200 ppm was rated as unacceptable (x).

TABLE 2

(parts by weight)

| | | Example | | | | | | |
|---|---|---|---|---|---|---|---|---|
| | | 1 | 2 | 3 | 4 | 5 | 6 | 7 |
| Epoxy resin | a | 100 | 100 | — | 60 | 60 | 60 | 100 |
| | b | — | — | 100 | 40 | 40 | 40 | — |
| Curing agent | a | 56.2 | — | 60.8 | 36.2 | 36.2 | 36.2 | — |
| | b | — | 94.1 | — | 36.2 | 36.2 | 36.2 | 94.1 |
| Thermoplastic resin | | — | 83.2 | 40.2 | 43.1 | 43.1 | 43.1 | 83.2 |
| Curing accelerator | A | — | — | — | — | — | — | — |
| | B | 0.67 | 1.94 | 1.61 | — | — | — | — |
| | C | — | — | — | 1.61 | — | — | — |
| | D | — | — | — | — | 1.61 | — | — |
| | E | — | — | — | — | — | 1.61 | — |
| | F | — | — | — | — | — | — | — |
| | G | — | — | — | — | — | — | — |
| | H | — | — | — | — | — | — | 1.94 |
| Resin dispersibility | | o | o | o | o | o | o | o |
| Pot life (change in viscosity) | | o | o | o | o | o | o | o |
| Curability | Reaction exothermic peak temperature (° C.) | 183 | 189 | 163 | 166 | 152 | 191 | 192 |
| | Calorific value proportion | 94% | 90% | 93% | 91% | 94% | 96% | 86% |
| | | o | o | o | o | o | o | o |
| Chloride ion content (ppm) | | o | o | o | o | o | o | o |

TABLE 3

(parts by weight)

| | | Comparative Example | | | | |
|---|---|---|---|---|---|---|
| | | 1 | 2 | 3 | 4 | 5 |
| Epoxy resin | a | 100 | 60 | 60 | 70 | 100 |
| | b | — | 40 | 40 | 30 | — |
| Curing agent | a | 56.2 | 36.2 | 36.2 | — | — |
| | b | — | 36.2 | 36.2 | — | — |
| | c | — | — | — | — | 56.9 |
| Thermoplastic resin | | — | 43.1 | 43.1 | 25 | — |
| Curing accelerator | A | 0.67 | — | — | — | — |
| | B | — | — | — | — | — |
| | C | — | — | — | — | — |
| | D | — | — | — | — | — |
| | E | — | — | — | — | — |
| | F | — | 1.61 | — | — | — |
| | G | — | — | 1.61 | 5.0 | — |
| | H | — | — | — | — | — |

TABLE 3-continued (parts by weight)

| | | Comparative Example | | | | |
|---|---|---|---|---|---|---|
| | | 1 | 2 | 3 | 4 | 5 |
| Resin dispersibility | | ○ | x | x | x | x |
| Pot life (change in viscosity) | | ○ | x | x | ○ | x |
| Curability | Reaction exothermic peak temperature (° C.) | 192 | 103 | 118 | 142 | 141 |
| | Calorific value proportion | 76% | 97% | 96% | 73% | 97% |
| | | x | ○ | ○ | x | ○ |
| Chloride ion content (ppm) | | ○ | ○ | x | x | ○ |

As can be understood from the above results, the epoxy resin compositions of Examples each contained a curing accelerator dispersed in a solid particulate form therein, and were free from a significant change in viscosity even after the storage at 35° C. for 24 hours as compared with the initial viscosity. Further, the epoxy resin compositions each had a reaction exothermic (DSC) peak temperature in the range of 150° C. to 200° C., and a reaction exothermic calorific value accounting for not less than 80% as measured within the temperature range of the DSC peak temperature±30° C. Thus, it was confirmed that the epoxy resin compositions of Examples were excellent in curability. Further, the epoxy resin compositions of Examples each had an eluted chloride ion content of not greater than 200 ppm. Thus, the epoxy resin compositions each had a reduced impurity ion content.

In contrast, the epoxy resin composition of Comparative Example 1 contained a curing accelerator dispersed in a solid particulate form therein, but had a reaction exothermic calorific value accounting for less than 80% as measured within the temperature range of its DSC peak temperature±30° C. because the curing accelerator had greater particle sizes. Therefore, the epoxy resin composition was inferior in curability with a broader DCS curve. The epoxy resin compositions of Comparative Examples 2 and 3 each contained a curing accelerator dissolved therein and, therefore, suffered from a significant change in viscosity after the storage at 35° C. for 24 hours. Further, the epoxy resin compositions of Comparative Examples 3 and 4 each had a chloride ion content of greater than 200 ppm and, therefore, had a possibility that electrically disadvantageous problems such as corrosion and migration of a metal would occur. The epoxy resin composition of Comparative Example 5 employed the melt-mixture of the curing agent and the curing accelerator, so that the curing accelerator was dispersed in a melt form in the epoxy resin composition. Therefore, the epoxy resin composition suffered from a significant change in viscosity after the storage at 35° C. for 24 hours.

INDUSTRIAL APPLICABILITY

The inventive epoxy resin composition for semiconductor encapsulation is used as a semiconductor element encapsulation material, a die attachment material, a prepreg material, an under-fill material and the like.

The invention claimed is:

1. A sheet-form epoxy resin composition for semiconductor encapsulation comprising the following components (A) to (D),
wherein the epoxy resin composition has a reaction exothermic peak temperature of 150° C. to 200° C. as measured by a differential scanning calorimeter with heating at a temperature increase rate of 10° C./min, and has a reaction exothermic calorific value accounting for not less than 80% of a total reaction exothermic calorific value as measured within a temperature range of the reaction exothermic peak temperature±30° C., (A) an epoxy resin having at least two epoxy groups in a molecule thereof;
(B) a compound having at least two phenolic hydroxyl groups in a molecule thereof;
(C) a powder of a compound represented by the following general formula (1), the powder having a maximum particle diameter of not greater than 30 μm and a standard deviation of not greater than 5 μm, the powder being dispersed in the epoxy resin composition:

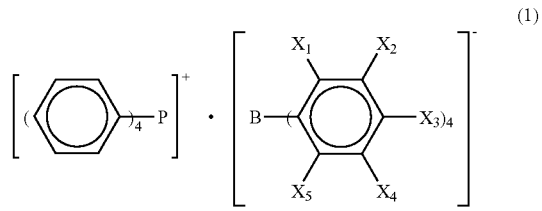

wherein $X_1$ to $X_5$, which may be the same or different, are each a hydrogen atom, an alkyl group having 1 to 9 carbon atoms, or a fluorine atom; and
(D) a thermoplastic resin, the proportion of the thermoplastic resin is 1 to 60 wt % based on the total weight of the organic resin component.

2. A semiconductor device produced by encapsulating a semiconductor element with a sheet-form epoxy resin composition for semiconductor encapsulation as recited in claim 1.

3. The sheet-form epoxy resin composition for semiconductor encapsulation of claim 1, wherein $X_1$ to $X_5$ are each hydrogen atom.

4. The sheet-form epoxy resin composition for semiconductor encapsulation of claim 1, wherein one of $X_1$ to $X_5$ is an alkyl group having 1 to 3 carbon atoms and the rest of $X_1$ to $X_5$ are each a hydrogen atom.

5. The sheet-form epoxy resin composition for semiconductor encapsulation of claim 1, wherein one of $X_1$ to $X_5$ is a fluorine atom and the rest of $X_1$ to $X_5$ are each a hydrogen atom.

6. The sheet-form epoxy resin composition for semiconductor encapsulation of claim 1, wherein the compound represented by general formula (I) is at least one compound selected from the group consisting of
tetraphenylphosphonium tetraphenylborate,
tetraphenylphosphonium tetra(4-methylphenyl)borate and
tetraphenylphosphonium tetra(4-fluorophenyl)borate.

* * * * *